United States Patent
Zhu et al.

(10) Patent No.: US 8,658,507 B2
(45) Date of Patent: Feb. 25, 2014

(54) MOSFET STRUCTURE AND METHOD OF FABRICATING THE SAME USING REPLACEMENT CHANNEL LAYER

(75) Inventors: Huilong Zhu, Poughkeepsie, NY (US); Haizhou Yin, Poughkeepsie, NY (US); Zhijiong Luo, Poughkeepsie, NY (US); Qingqing Liang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 176 days.

(21) Appl. No.: 12/990,714

(22) PCT Filed: Jun. 24, 2010

(86) PCT No.: PCT/CN2010/074397
§ 371 (c)(1),
(2), (4) Date: Apr. 28, 2011

(87) PCT Pub. No.: WO2011/079596
PCT Pub. Date: Jul. 7, 2011

(65) Prior Publication Data
US 2011/0227170 A1    Sep. 22, 2011

(30) Foreign Application Priority Data
Dec. 30, 2009   (CN) .......................... 2009 1 0244516

(51) Int. Cl.
*H01L 21/336*    (2006.01)
(52) U.S. Cl.
USPC ................. 438/303; 257/410; 257/E21.433; 257/E29.255

(58) Field of Classification Search
USPC ............ 438/303; 257/410, E21.433, E29.255
See application file for complete search history.

(56) References Cited

U.S. PATENT DOCUMENTS

| | | | |
|---|---|---|---|
| 2002/0037619 A1 | 3/2002 | Sugihara et al. | |
| 2007/0238255 A1 | 10/2007 | Miyano et al. | |

FOREIGN PATENT DOCUMENTS

| | | |
|---|---|---|
| CN | 1 591 803 | 8/2004 |
| JP | 2001-044421 | 2/2001 |

OTHER PUBLICATIONS

Summary Translation of Written Opinion and Written Opinion for PCT Application No. PCT/CN2010/074397, 4 pages.

*Primary Examiner* — Stephen W Smoot
*Assistant Examiner* — Vivki B Booker
(74) *Attorney, Agent, or Firm* — Westman, Champlin & Koehler, P.A.

(57) ABSTRACT

There is provided a MOSFET structure and a method of fabricating the same. The method includes: providing a semiconductor substrate; forming a dummy gate on the semiconductor substrate; forming source/drain regions; selectively etching the dummy gate to a position where a channel is to be formed; and epitaxially growing a channel layer at the position where the channel is to be formed and forming a gate on the channel layer, wherein the channel layer comprises a material of high mobility. Thereby, the channel of the device is replaced with the material of high mobility after the source/drain region is formed, and thus it is possible to suppress the short channel effect and also to improve the device performance.

16 Claims, 6 Drawing Sheets

MOSFET STRUCTURE AND METHOD OF FABRICATING THE SAME USING REPLACEMENT CHANNEL LAYER

CROSS-REFERENCE TO RELATED APPLICATION

This Application is a Section 371 National Stage Application of International Application No. PCT/CN2010/074397, filed 24 Jun. 2010, not yet published, the contents of which are hereby incorporated by reference in their entirety.

FIELD OF INVENTION

The present invention generally relates to the field of semiconductor devices and the fabrication thereof, and more particularly, to a Metal Oxide Semiconductor Field Effect Transistor (MOSFET) structure and a method of fabricating the same.

BACKGROUND

With the developing of the semiconductor technology, transistors are increasingly scaled, resulting in increased speeds of devices and systems. However, when a transistor channel is shrunk to a certain extent, there will be the short channel effect, which causes increased leakage current, reduced switching efficiency, and increased power consumption and heat generation. Therefore, the device will fail to function properly if its dimension exceeds some limit.

In view of the above problems, there is a need for a novel MOSFET structure and a method of fabricating the same, whereby it is possible to effectively cope with problems such as the short channel effect due to the reduced device dimensions, and to improve the turn-on current over a unit length of the transistor.

SUMMARY OF THE INVENTION

In view of the above problems, it is an object of the present invention to provide a MOSFET structure and a method of fabricating the same, whereby it is possible to overcome limits due to scaling down of device dimensions, and especially to suppress the short channel effect.

According to an aspect of the present invention, there is provided a method of fabricating a MOSFET, comprising: providing a semiconductor substrate; forming a dummy gate on the semiconductor substrate; forming source/drain regions; selectively etching the dummy gate to a position where a channel is to be formed; and epitaxially growing a channel layer at the position where the channel is to be formed and forming a gate on the channel layer, wherein the channel layer comprises a material of high mobility.

Preferably, the material of high mobility may comprise SiGe with 50-100 atomic percent of Ge.

Preferably, the method may further comprise forming a channel preparation layer on the semiconductor substrate before the dummy gate is formed, and the step of selectively etching the dummy gate to a position where a channel is to be formed may comprise selectively etching the dummy gate and further etching the channel preparation layer until the surface of the semiconductor substrate is exposed.

Preferably, the channel preparation layer may comprise SiGe with 5-15 atomic percent of Ge.

Preferably, the step of forming source/drain regions may comprise: carrying out source/drain extension implantation by using the dummy gate as a mask; forming spacers on sidewalls of the dummy gate; carrying out etching with respect to regions at both sides of the spacers where the source/drain regions are to be formed, wherein the etching extends into the semiconductor substrate to a certain depth; epitaxially growing a source/drain material layer on the etched semiconductor substrate, wherein the material for the source/drain material layer is selected so that it applies stress to the channel layer; and doping the source/drain material layer (1010) to form the source/drain regions.

Preferably, the source/drain material layer may comprise SiGe with 20-70 atomic percent of Ge.

Alternatively, the source/drain material layer may comprise Si:C with 0.2-2 atomic percent of C.

Preferably, the step of forming the dummy gate on the semiconductor substrate may comprise: sequentially forming a dummy gate dielectric layer, a dummy gate body layer, a dummy gate etching stop layer and a cap layer on the channel preparation layer; and pattering the dummy gate body layer, the dummy gate etching stop layer and the cap layer to form the dummy gate.

Alternatively, the step of selectively etching the dummy gate may comprise: sequentially depositing a polishing stop layer and an etching stop layer on the semiconductor substrate with the dummy gate and the source/drain region formed thereon; polishing the etching stop layer to the polishing stop layer; further etching back the etching stop layer; etching the cap layer away by using the dummy gate etching stop layer and the etching stop layer as a stop layer; sequentially etching the dummy gate etching stop layer, the dummy gate body layer, the dummy gate dielectric layer and the channel preparation layer until the semiconductor substrate is exposed.

Preferably, the step of epitaxially growing the channel layer may comprise: epitaxially growing the channel layer on the exposed portion of the semiconductor substrate.

Preferably, the method may further comprise: carrying out shallow well implantation after the channel layer is epitaxially grown and before the gate is formed on the channel layer.

Alternatively, the method may further comprise: carrying out shallow well implantation before the channel layer is epitaxially grown.

Preferably, the step of forming the gate on the channel layer may comprise: depositing a high-k material layer on the channel layer; and depositing a metal layer on the high-k material layer to form a metal gate electrode.

Preferably, the high-k material may comprise at least one selected from a group including $Al_2O_3$, $HfO_2$, $ZrO_2$, $La_2O_3$, ZAZ, $TiO_2$ and STO.

Preferably, the metal may comprise at least one selected from a group including TaC, TiN, TaTbN, TaErN, TaYbN, TaSiN, HfSiN, MoSiN, $RuTa_x$, $NiTa_x$, $MoN_x$, TiSiN, TiCN, TaAlC, TiAlN, TaN, $PtSi_x$, $Ni_3Si$, Pt, Ru, Ir, Mo, HfRu, $RuO_x$, and W.

Preferably, the method may further comprise: depositing a protection layer on the entire semiconductor substrate after the gate is formed.

Preferably, after depositing the protection layer, the method may further comprise: forming contact holes at the source/drain regions, wherein the bottoms of the contact holes extend into the source/drain material layer; depositing a metal layer on the bottoms of the contact holes so that the metal layer reacts with the source/drain material layer to form a silicide layer, and removing the unreacted metal layer; depositing a diffusion block layer on the bottoms and sidewalls of the contact holes; and filling the contact holes with a metal to form source/drain contacts.

According to another aspect of the present invention, there is provided a MOSFET fabricated according to the above method.

According to the embodiments of the present invention, the material of high mobility is used for the channel layer. Therefore, it is possible to increase the carrier mobility in the channel region with a given on current over a unit length, and thus to reduce the leakage current. Further, according to the embodiments of the present invention, the source/drain region is formed before the channel layer is formed. Therefore, it is possible to reduce defects in the channel layer and prevent dopant(s) in the source/drain region from diffusing into the channel layer, and thus to effectively improve the device performance.

BRIEF DESCRIPTION OF THE DRAWINGS

The above and other objects, features and advantages of the present invention will be more apparent by describing embodiments thereof in detail with reference to the attached drawings, wherein.

DETAILED DESCRIPTION OF PREFERRED EMBODIMENTS

Figure 1:
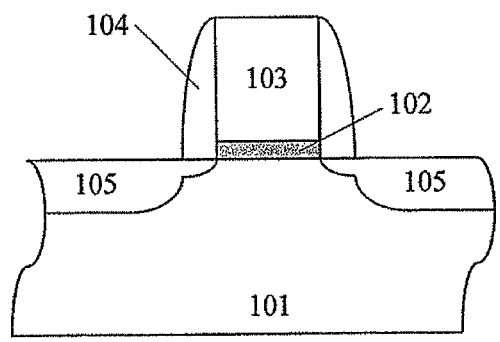
FIG. 1 is a simplified schematic view showing a conventional transistor.

Hereinafter, the present invention is described with reference to embodiments shown in the attached drawings. However, it is to be understood that those descriptions are just provided for illustrative purpose, rather than limiting the present invention. Further, in the following, descriptions of known structures and techniques are omitted so as not to obscure the concept of the present invention.

In the drawings, various structural diagrams and sectional views of semiconductor devices according to embodiments of the present invention are shown. However, they are not drawn to scale, and some features may be enlarged while some features may be omitted for clarity. Shapes, sizes and relative locations of respective regions and layers shown in the drawings are just illustrative, and deviations therefrom may occur due to manufacture tolerances and technical limits. Those skilled in the art can also devise regions/layers of different shapes, sizes and relative locations as desired.

FIG. 1 is a simplified schematic view showing a conventional transistor. Specifically, the transistor comprises a semiconductor substrate 101, a gate dielectric layer 102 (for example, $SiO_2$) formed on the semiconductor substrate 101, a gate body 103 (for example, poly silicon) formed on the gate dielectric layer 102, spacers 104 (for example, SiN) formed on sidewalls of the gate region, and source/drain regions 105 formed in the semiconductor substrate 101. There are various ways to fabricate such a transistor in the prior art, and detailed descriptions thereof are omitted here.

As described above in the background, the transistor shown in FIG. 1 has problems such as increased leakage current with being scaled down of the dimensions thereof. It is possible to significantly solve those problems by using a material of high mobility for the channel region. To do this, for example, a layer of the material of high mobility may be deposited on the semiconductor substrate 101 firstly, and then the gate region (including the gate dielectric layer 102 and the gate electrode 103), the spacers 104 and the source/drain regions 105 are formed as in the prior art. Thus, a portion of the layer of the material of high mobility beneath the gate region serves as the channel region, so that the mobility in the channel region is improved.

However, according to the prior art, in forming the source/drain regions 105, processes such as dopants implantation and anneal at high temperature are carried out, so as to performing effective doping on the source/drain regions. Such processes at the high temperature will increase defects in the layer of the material of high mobility, making the performance thereof affected.

In view of this, according to an embodiment of the present invention, there is provided a method of fabricating a MOSFET, comprising: firstly forming a dummy gate on a semiconductor substrate, and then forming source/drain regions; after the source/drain regions are formed, selectively etching the dummy gate until reaching the position where a channel is to be formed; and expitaxially growing a channel layer at the position and forming a gate on the channel layer.

Specifically, firstly, as shown in FIG. 1, a dummy gate (including a dummy gate dielectric layer 102 and a dummy gate body 103) is formed on a semiconductor substrate, and then, based on the dummy gate, source/drain regions 105 are formed.

There are various ways to form the source/drain regions 105 based on the dummy gate. For example, this can be done as follows: carrying out extension implantation by using the dummy gate as a mask, so as to form very shallow source/drain extensions (SDEs) at both ends of the channel, wherein shallow junctions caused by the SDEs at the both ends of the channel will help suppress the short channel effect; and then forming spacers 104 on sidewalls of the dummy gate, and carrying out source/drains implantation by using the dummy gate and the spacers 104 as a mask so as to form the source/drain regions 105.

Figure 2:
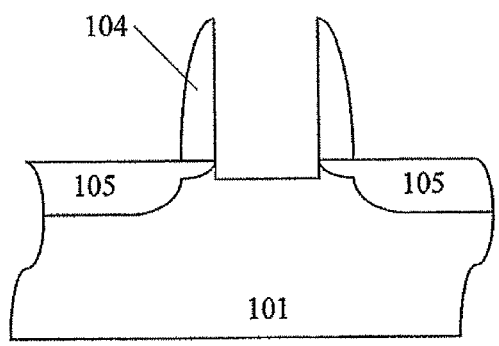
FIGS. 2-4 are schematic views showing structures at respective steps during a flow of fabricating a MOSFET according to an embodiment of the present invention.
Figure 3:
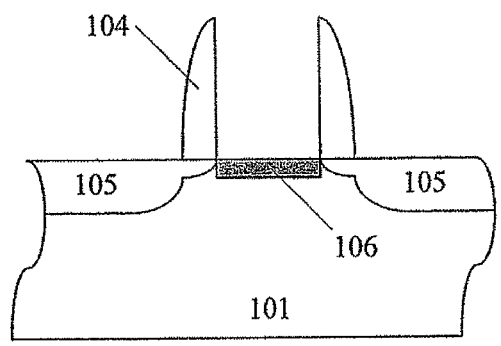
Figure 4:
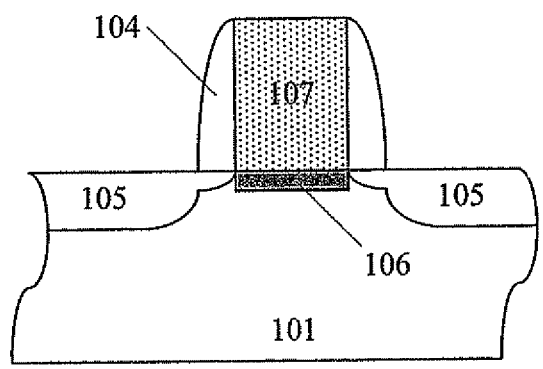

Next, as shown in FIG. 2, the dummy gate is selectively etched. Specifically, the dummy gate body 103 and the dummy gate dielectric layer 102 as well as a portion of the substrate are etched away. The portion of the substrate which is etched away corresponds to the channel region to be formed. Subsequently, as shown in FIG. 3, a channel layer 106 is formed at the position of the portion of the substrate 101 which is etched away, to function as the channel region of the MOSFET to be fabricated. The channel layer 106 comprises a material of high mobility. After the channel layer 106 is formed, a gate 107 may be formed again, as shown in FIG. 4 (where the details of the gate 107 are not shown).

Thus, according to the embodiment of the present invention, the channel layer 106 (corresponding to the channel region) is formed after the source/drain regions 105 are formed. This means that a channel region of a MOSFET (as shown in FIG. 1) is replaced (with, for example, the channel layer 106 as shown in FIG. 3). Therefore, it is possible to protect the channel region from the anneal at high temperature necessary in forming the source/drain regions 105. Further, it is possible to prevent the dopant(s) from diffusing into the channel region, and thus to alleviate the short channel effect.

For example, the material of high mobility comprises SiGe, which can increase the mobility in the channel region and thus improve the device performance. Alternatively, the material of high mobility comprises group III-V semiconductor compounds such as InP, InAlAs, and InGaAs.

In the above embodiment, in selectively etching the dummy gate, the etching is carried out directly into the substrate 101, so that the channel can be replaced. However, the etching depth into the substrate 101 cannot be well controlled, and thus it is difficult to control the position of the channel layer 106 relative to the source/drain regions. As a result, the resistance between the channel layer 106 and the source/drain regions is likely to increase, which will deteriorate the performance of the transistor. In order to control the formation of the channel layer, preferably, a channel preparation layer is formed on the semiconductor substrate, wherein the channel preparation layer corresponds to the position where the final channel layer is to be formed. A dummy gate and source/drain regions are sequentially formed on the semiconductor substrate with the channel preparation layer formed thereon. Next, the dummy gate is selectively etched, and the channel preparation layer is further etched until the surface of the semiconductor substrate is exposed. Then, a channel layer is formed on the semiconductor substrate, That is, the channel preparation layer formed in advance is replaced with the final channel layer, whereby it is easier to control the position of the final channel layer.

FIGS. 5-18 are schematic views showing structures during a flow of fabricating a MOSFET according to an embodiment of the present invention. Hereinafter, the embodiment is described in detail with reference to the drawings.

Figure 5:
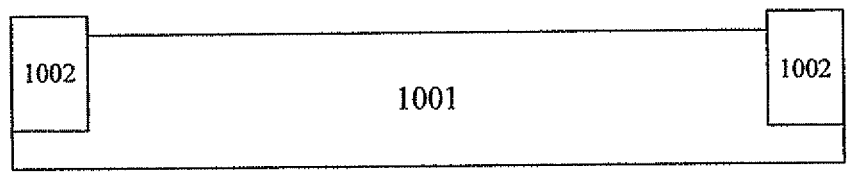
FIGS. 5-18 are schematic views showing structures at respective steps during a flow of fabricating a MOSFET according to another embodiment of the present invention.

As shown in FIG. 5, a semiconductor substrate 1001, for example, a Si substrate, is provided. According to a preferred embodiment of the present invention, shallow trench isolations (STIs) 1002 may be formed on the semiconductor substrate 1001. The STIs 1002 may comprise $SiO_2$, for example. The whole substrate is patterned so that the semiconductor substrate 1001 is recessed to a certain depth relative to the STIs 1002.

Figure 6:
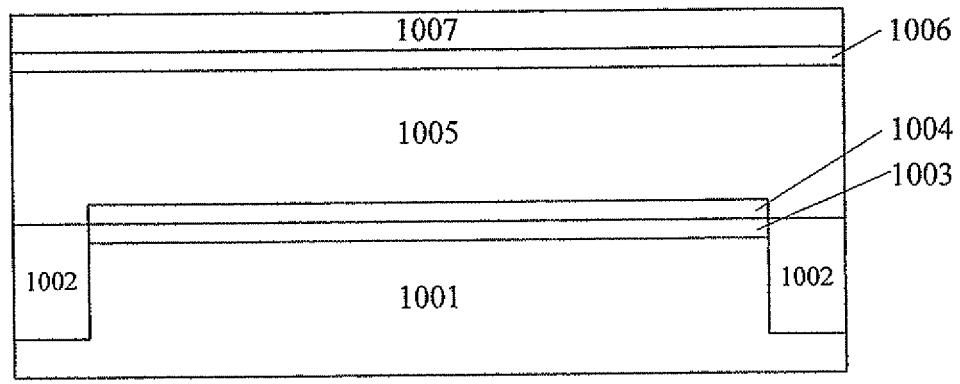

Then, as shown in FIG. 6, a channel preparation layer 1003 is selectively epitaxially grown on the semiconductor substrate 1001. The position where the channel preparation layer 1003 is located corresponds to the position where the channel layer is to be formed. Preferably, the channel preparation layer 1003 comprises the same material as that of the channel layer to be formed. As described above, the portion of the channel preparation layer 1003 beneath the (dummy) gate, corresponding to the channel region, will be "replaced" with the channel layer in the subsequent process.

In the present invention, the channel layer may be formed of SiGe, for example. Thus, the channel preparation layer 1003 preferably comprises SiGe. For example, the channel preparation layer 1003 comprises SiGe with 5-15 atomic percent of Ge, and has a thickness of about 3-7 nm.

After the channel preparation layer 1003 is formed, as described above, a dummy gate is formed on the substrate. Specifically, a dummy gate stack is formed on the whole substrate (including the semiconductor substrate 1001, the STIs 1002, and the channel preparation layer 1003). For example, a dummy gate dielectric layer 1004 (for example, $SiO_2$), a dummy gate body layer 1005 (for example, poly silicon), and a dummy gate etching stop layer 1006 (for example, $SiO_2$) may be sequentially deposited on the substrate. For example, the dummy gate body layer 1005 may have a thickness of about 30-60 nm, and the dummy gate etching stop layer 1006 may have a thickness of about 10-20 nm.

Preferably, a cap layer 1007 is further formed on the dummy gate stack. The cap layer 1007 is provided for covering the gate region in carrying out epitaxial growing at the source/drain regions so as to prevent the epitaxial growing from occurring at the gate region. For example, the cap layer may comprise $Si_3N_4$, and may have a thickness of about 20-50 nm.

Figure 7:
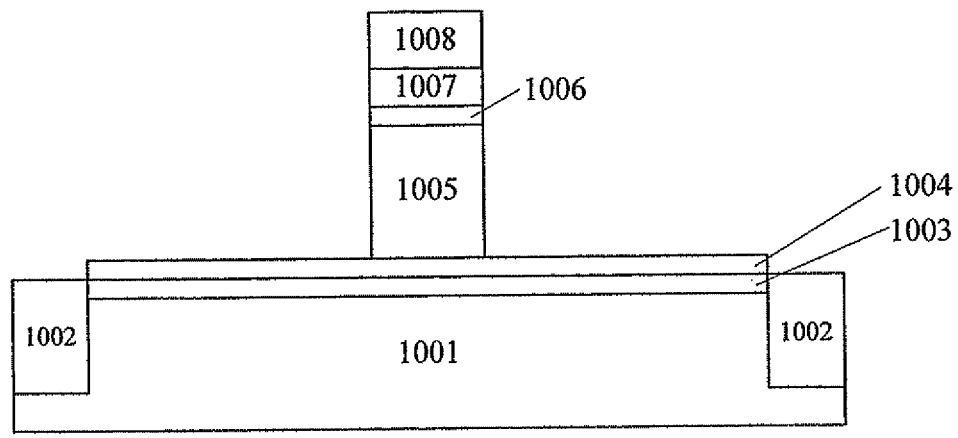

Next, as shown in FIG. 7, a photoresist layer 1008 is coated on the resultant structure shown in FIG. 6, and is patterned. Then, etching, for example, reaction ion etching (RIE), is performed so as to form the dummy gate. Here, preferably, the dummy gate dielectric layer 1004 is used as an etching stop layer. Specifically, the dummy gate body layer 1005, the dummy gate etching stop layer 1006, and optionally the cap layer 1007, if present, are etched until the dummy gate dielectric layer 1004 is reached. Thus, by using the dummy gate dielectric layer 1004 as the etching stop layer, it is possible to protect the underlying channel preparation layer 1003 from unnecessary etching.

Figure 8:
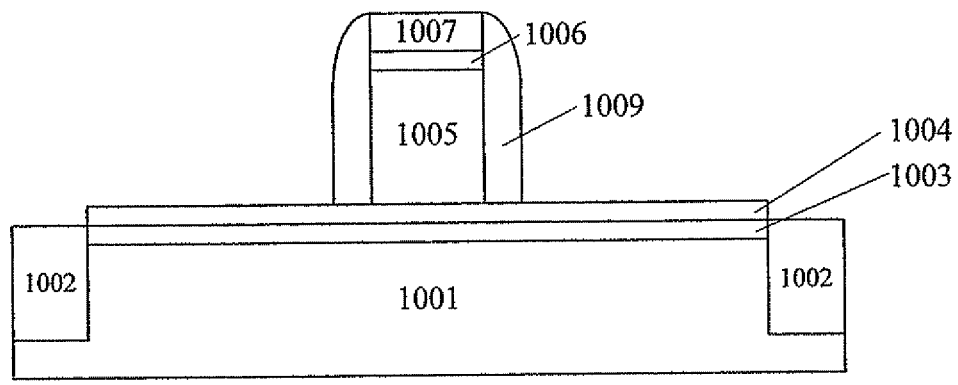

After the dummy gate is formed, as described above, source/drain regions are formed in the substrate. Specifically, as shown in FIG. 8, the photoresist layer 1008 is removed. Then SDE implantation is carried out by using the dummy gate as a mask. For example, in forming a p-type MOSFET (PMOSFET), p-type dopants such as B or $BF_2$ may be implanted; while in forming an n-type MOSFET (NMOSFET), n-type dopants such as As or P may be implanted. The doping concentration may be about $1E19$-$4E20$ $cm^{-2}$. If necessary, spike anneal (at about 1000-1080° C.) may be carried out to activate the dopant(s). Then, spacers 1009 are formed on the sidewalls of the dummy gate. For example, the spacers 1009 may comprise $Si_3N_4$.

Figure 9:
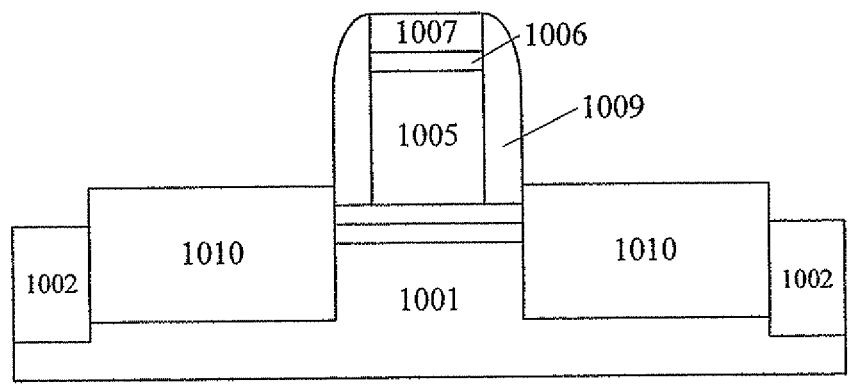

After the resultant structure shown in FIG. 8 is formed, the source/drain regions may be formed by further doping. Here, preferably, in order to apply stress to the channel layer so as to generate strain in the channel layer and thus to further increase the mobility in the channel region, the source/drain regions may be formed as follows. Specifically, as shown in FIG. 9, the dummy gate dielectric layer 1004 and the channel preparation layer 1003 are selectively etched (for example, by RIE), and further the semiconductor substrate 1001 is etched back. Then, a source/drain material layer 1010 is selectively epitaxially grown on the exposed portion of the semiconductor substrate 1001. The material for the source/drain material layer 1010 is selected so that it applies stress to the channel region. For example, the source/drain material layer 1010 may comprise SiGe with 20-70 atomic percent of Ge or Si:C with 0.2-2 atomic percent of C.

In epitaxially growing the source/drain regions, the dummy gate is covered by the cap layer 1007 (for example, $Si_3N_4$), and thus the epitaxial growing will not occur on the dummy gate.

Here, the source/drain material layer 1010 (for example, SiGe or Si:C) may be doped in situ. That is, the atoms of the dopants are introduced while growing the source/drain material layer 1010. Alternatively, it may be doped by ion implantation. That is, dopant(s) is (are) introduced by ion implantation after the source/drain material layer 1010 is grown. If necessary, anneal may be carried out to activate the dopant(s).

Figure 10:
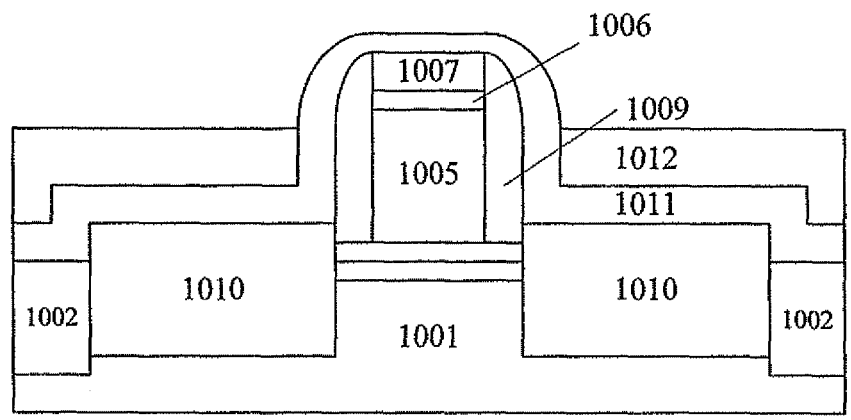

As described above, after the dummy gate and the source/drain regions are formed, it is necessary to selectively etch the dummy gate so as to etch away the originally formed channel region and replace it. In order to well control the selective etching on the dummy gate, preferably, as shown in FIG. 10, a polishing stop layer 1011 and an etching stop layer 1012 are sequentially deposited on the resultant structure shown in FIG. 9. The polishing stop layer 1011 serves as a stop layer when polishing (for example, chemical mechanical polishing (CMP)) the etching stop layer 1002, and may comprise SiN, for example. The etching stop layer 1012 serves as a stop layer when etching the cap layer 1007, and may comprise $SiO_2$, for example. After the etching stop layer 1012 is deposited, CMP is performed on this layer until the polishing stop layer 1011 is exposed. The etching stop layer 1012 is further etched back.

Figure 11:
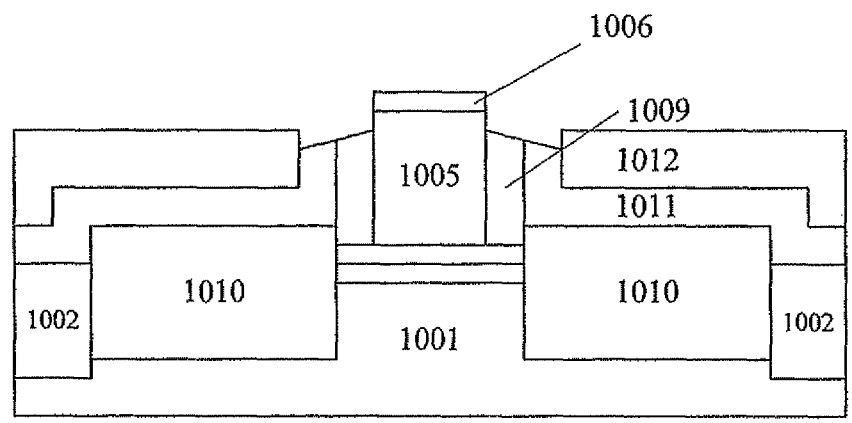

Next, as shown in FIG. 11, selective etching is carried out to remove the cap layer 1007 on the top of the dummy gate. Due to the presence of the dummy gate etching stop layer 1006 (for example, $SiO_2$) and the etching stop layer 1012 (for example, $SiO_2$), the resultant structure shown in FIG. 11 is obtained after etching.

Figure 12:
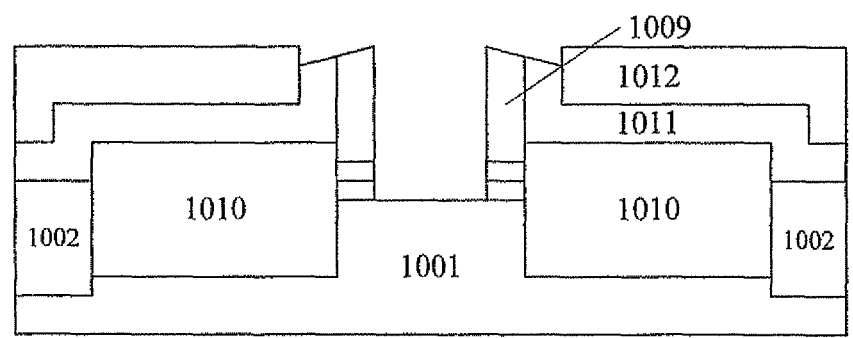

Then, as shown in FIG. 12, the dummy gate is further etched. Specifically, the dummy gate etching stop layer 1006 is etched away, and the dummy gate body layer 1005, the dummy gate dielectric layer 1004, and the channel preparation layer 1003 are also etched (for example, by RIE) until the surface of the semiconductor substrate 1001 is exposed.

Figure 13:
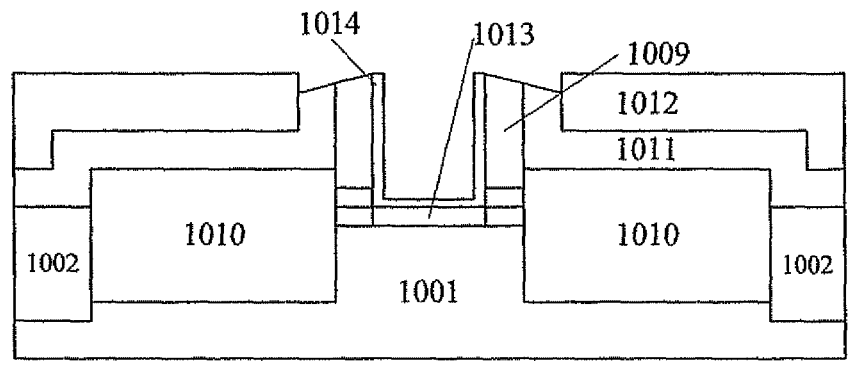

Subsequently, as shown in FIG. 13, a channel layer 1013 is epitaxially grown on the exposed portion of the semiconductor substrate 1001. For example, the channel layer 1003 may comprise SiGe with 50-100 atomic percent of Ge, and may have a thickness of about 2-5 nm.

Preferably, to further suppress the short channel effect, shallow well implantation may be carried out with respect to the portion beneath the channel layer 1003. For example, in forming a PMOSFET, a shallow n well may be formed, that is, n-type dopants such as As may be implanted; while in forming a NMOSFET, a shallow p well may be formed, that is, p-type dopants such as B may be implanted. The formation of such wells helps block the punch-through current and thus suppress the short channel effect. If necessary, laser anneal may be carried out to activate the dopants. Here, the shallow well implantation and laser anneal may be carried out prior to the epitaxial growing of the channel layer 1013, so as to reduce the defects caused by the laser anneal.

After the channel layer 1013 is formed as above, a gate may be formed subsequently, Since the thickness of the gate dielectric layer is increasingly reduced with the scaling of the device dimensions, a high-k material is preferably used for the gate dielectric layer to reduce the leakage current. Here, a high-k material layer 1014 is deposited on the channel layer 1013. For example, a layer of $HfO_2$ with a thickness of about 2-5 nm may be deposited, as the high-k material layer 1014. Generally, a high-k material refers to one having a dielectric constant k greater than 4.0. For example, the high-k material may comprise at least one selected from a group including $Al_2O_3$, $HfO_2$, $ZrO_2$, $La_2O_3$, ZAZ, $TiO_2$ and STO.

Figure 14:
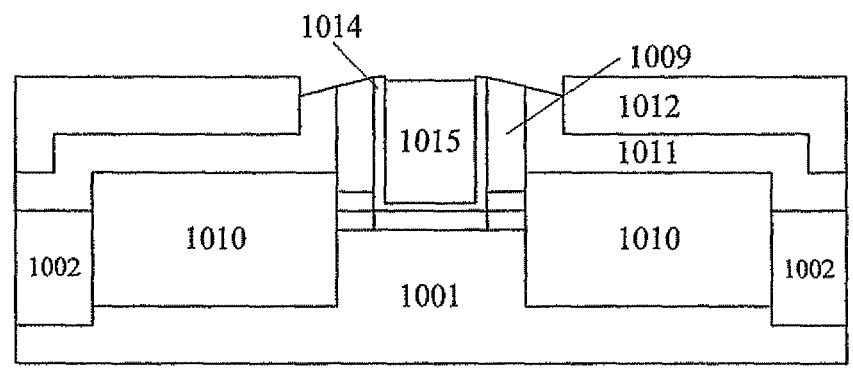

Next, as shown in FIG. 14, a metal layer is deposited on the high-k material layer and then is etched back, so as to form a metal gate electrode 1015. For example, the metal layer may comprise at least one selected from a group including TaC, TiN, TaTbN, TaErN, TaYbN, TaSiN, HfSiN, MoSiN, $RuTa_x$, $NiTa_x$, $MoN_x$, TiSiN, TiCN, TaAlC, TiAlN, TaN, $PtSi_x$, $Ni_3Si$, Pt, Ru, Ir, Mo, HfRu, $RuO_x$, and W. Thus, the MOSFET according to the embodiment of the present invention is finally obtained.

Figure 15:
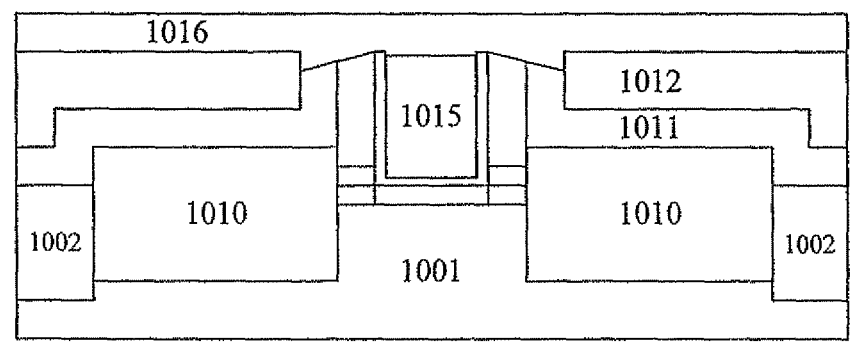

After the MOSFET as described above is completed, a protection layer 1016 may be further deposited on the whole device as shown in FIG. 15 so as to protect the device. The protection layer 1016 may comprise $Si_3N_4$, for example.

Figure 16:
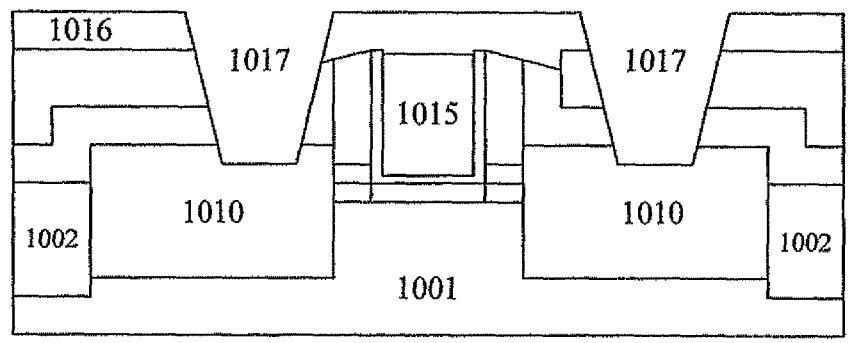

After the protection layer 1016 is formed, contact holes 1017 may be formed at the source/drain regions to form source/drain contacts, as shown in FIG. 16. The bottoms of the contact holes 1017 contact, and preferably extend into, the source/drain material layer 1010, so as to well contact the source/drain regions.

Figure 17:
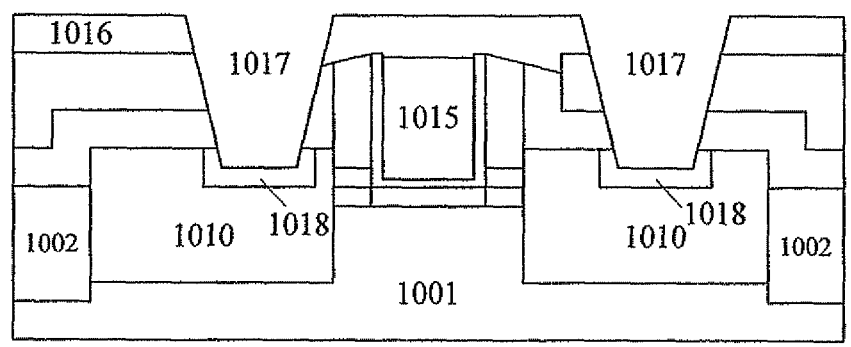

In order to reduce contact resistances, preferably, as shown in FIG. 17, a metal layer, for example Ni, is deposited on the bottoms of the contact holes, and anneal is carried out at 300-500° C. so that the metal layer reacts with the source/drain material layer 1010 to form metal silicide 1018 such as NiSi around the bottoms of the contact holes 1017. Then, the unreacted metal layer is removed.

Figure 18:
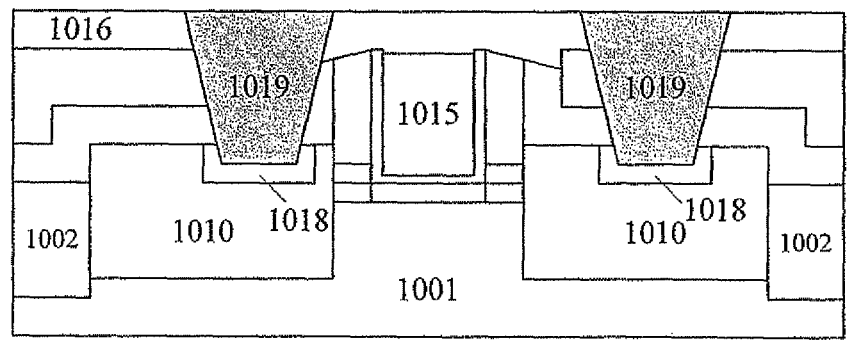

Next, as shown in FIG. 18, a metal such as W is filled into the contact hole 1017 to form source/drain contacts 1019. Preferably, before the metal is filled, a diffusion block layer (not shown), for example TiN, may be deposited on the bottoms and sidewalls of the contact holes 1017 for preventing the metal from diffusing.

In the above description, details of pattering and etching of the respective layers are not provided. It is to be understood by those skilled in the art that various means in the prior art may be utilized to form the layers and regions in desired shapes. Further, to achieve the same feature, those skilled can devise different methods than those described above.

The present invention is described above with reference to the embodiments thereof. However, those embodiments are provided just for illustrative purpose, rather than limiting the present invention. The scope of the invention is defined by the attached claims as well as equivalents thereof. Those skilled in the art can make various alternations and modifications without departing from the scope of the invention, which all fall into the scope of the invention.

What is claimed is:

1. A method of fabricating a Metal Oxide Semiconductor Field Effect Transistor (MOSFET), comprising:
   forming a channel preparation layer on a surface of a semiconductor substrate;
   forming a dummy gate comprising a dummy gate dielectric layer and a dummy gate body layer on the channel preparation layer;
   forming source/drain regions;
   selectively etching the dummy gate body layer and the dummy gate dielectric layer and selectively etching the channel preparation layer to expose the surface of the semiconductor substrate; and
   epitaxially growing a channel layer on the surface of the semiconductor substrate and forming a gate on the channel layer,
   wherein the channel layer comprises a material of high mobility.

2. The method according to claim 1, wherein the material of high mobility comprises SiGe with 50-100 atomic percent of Ge.

3. The method according to claim 1, wherein the channel preparation layer comprises SiGe with 5-15 atomic percent of Ge.

4. The method according to claim 1, wherein the step of forming source/drain regions comprises:
   carrying out source/drain extension implantation by using the dummy gate as a mask;
   forming spacers on sidewalls of the dummy gate;
   carrying out etching with respect to regions at both sides of the spacers where the source/drain regions are to be formed, wherein the etching extends into the semiconductor substrate to a certain depth;
   epitaxially growing a source/drain material layer on the etched semiconductor substrate, wherein the material for the source/drain material layer is selected so that it applies stress to the channel layer; and
   doping the source/drain material layer to form the source/drain regions.

5. The method according to claim 4, wherein the source/drain material layer comprises SiGe with 20-70 atomic percent of Ge.

6. The method according to claim 4, wherein the source/drain material layer comprises Si:C with 0.2-2 atomic percent of C.

7. The method according to claim 4, wherein the step of forming the dummy gate on the semiconductor substrate comprises:
sequentially forming a preliminary dummy gate dielectric layer, a preliminary dummy gate body layer, a dummy gate etching stop layer and a cap layer on the channel preparation layer; and
pattering the preliminary dummy gate body layer, the dummy gate etching stop layer and the cap layer to form the dummy gate, wherein the patterned preliminary dummy gate body layer forms the dummy gate body layer.

8. The method according to claim 7, wherein the step of selectively etching the dummy gate comprises:
sequentially depositing a polishing stop layer and an etching stop layer on the semiconductor substrate with the dummy gate and the source/drain regions formed thereon;
polishing the etching stop layer to the polishing stop layer;
further etching back the etching stop layer;
etching the cap layer away by using the dummy gate etching stop layer and the etching stop layer as a stop layer;
sequentially etching the dummy gate etching stop layer, the preliminary dummy gate body layer, the preliminary dummy gate dielectric layer and the channel preparation layer until the semiconductor substrate is exposed, wherein the etched preliminary gate dielectric layer forms the dummy gate dielectric layer.

9. The method according to claim 1, wherein the method further comprises:
carrying out shallow well implantation after the channel layer is epitaxially grown and before the gate is formed on the channel layer.

10. The method according to claim 9, wherein the method further comprises:
carrying out shallow well implantation before the channel layer is epitaxially grown.

11. The method according to claim 1, wherein the step of forming the gate on the channel layer comprises:
depositing a high-k material layer on the channel layer; and
depositing a metal layer on the high-k material layer to form a metal gate electrode.

12. The method according to claim 11, wherein the high-k material comprises at least one selected from a group including $Al_2O_3$, $HfO_2$, $ZrO_2$, $La_2O_3$, ZAZ, $TiO_2$ and STO.

13. The method according to claim 11, wherein the metal comprises at least one selected from a group including TaC, TiN, TaTbN, TaErN, TaYbN, TaSiN, HfSiN, MoSiN, $RuTa_x$, $NiTa_x$, $MoN_x$, TiSiN, TiCN, TaAlC, TiAlN, TaN, $PtSi_x$, $Ni_3Si$, Pt, Ru, Ir, Mo, HfRu, $RuO_x$, and W.

14. The method according to claim 11, wherein the method further comprises:
depositing a protection layer on the entire semiconductor substrate after the gate is formed.

15. The method according to claim 14, wherein after depositing the protection layer, the method further comprises:
forming contact holes with their bottoms reaching the source/drain regions;
depositing a metal layer on the bottoms of the contact holes so that the metal layer reacts with portions of the source/drain regions to form a silicide layer, and removing the unreacted metal layer;
depositing a diffusion block layer on the bottoms and sidewalls of the contact holes; and
filling the contact holes with a metal to form source/drain contacts.

16. A Metal Oxide Semiconductor Field Effect Transistor (MOSFET) fabricated by the method according to claim 1.

* * * * *